(12) United States Patent
Shibata (10) Patent No.: US 8,115,529 B2
(45) Date of Patent: Feb. 14, 2012

(54) DEVICE AND CONTROL METHOD OF DEVICE

(75) Inventor: Tomoyuki Shibata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 63 days.

(21) Appl. No.: 12/461,813

(22) Filed: Aug. 25, 2009

(65) Prior Publication Data

US 2010/0052739 A1 Mar. 4, 2010

(30) Foreign Application Priority Data

Aug. 28, 2008 (JP) .............................. P2008-219744

(51) Int. Cl.
*H03K 3/02* (2006.01)

(52) U.S. Cl. ........ 327/198; 327/149; 327/158; 327/115; 327/117

(58) Field of Classification Search .................. 327/141, 327/144–163, 108–112, 379, 389, 391; 331/15–17; 375/373–376; 326/22–27, 81–87
See application file for complete search history.

(56) References Cited

U.S. PATENT DOCUMENTS

| | | | |
|---|---|---|---|
| 6,181,174 B1 * | 1/2001 | Fujieda et al. ................ | 327/158 |
| 6,701,445 B1 * | 3/2004 | Majos ........................... | 713/500 |
| 7,038,971 B2 * | 5/2006 | Chung ...................... | 365/189.16 |
| 7,230,461 B1 * | 6/2007 | Savoj ............................. | 327/156 |
| 7,234,069 B1 * | 6/2007 | Johnson ........................ | 713/400 |
| 7,296,173 B2 * | 11/2007 | Nambu et al. ................. | 713/401 |
| 7,394,319 B2 * | 7/2008 | Hirai ............................. | 331/1 A |

FOREIGN PATENT DOCUMENTS

| | | |
|---|---|---|
| JP | 9-186680 | 7/1997 |
| JP | 09186680 * | 7/1997 |
| JP | 2000-163968 | 6/2000 |
| JP | 2000-269784 | 9/2000 |
| JP | 2004-326290 | 11/2004 |
| JP | 2007-97134 | 4/2007 |

* cited by examiner

*Primary Examiner* — Lincoln Donovan
*Assistant Examiner* — Brandon s Cole
(74) *Attorney, Agent, or Firm* — McGinn Intellectual Property Law Group, PLLC (57) ABSTRACT

A frequency divider section generates a frequency-divided clock RSELO by dividing the frequency of an internal clock LCLK, which lags behind an external clock in phase, and generates a delayed frequency-divided clock RSELI by delaying the frequency-divided clock RSELO. A signal input from the outside in synchronization with an internal clock PCLK which lags behind the external clock in phase is held in a latch circuit in synchronization with the delayed frequency-divided clock RSELI. Then, an output signal of the latch circuit is read into a latch circuit in synchronization with the frequency-divided clock RSELO and is output as a signal which is synchronized with the internal clock LCLK. In addition, a frequency divider section includes a variable divider which divides the frequency of the internal clock LCLK by a predetermined divide ratio which can be changed.

18 Claims, 9 Drawing Sheets

|    | DIV2 | DIV24 |
|----|------|-------|
| F1 | 0    | 0     |
| F2 | 0    | 1     |
| F3 | 1    | 0     |
| F4 | 1    | 1     |

DEVICE AND CONTROL METHOD OF DEVICE

BACKGROUND OF THE INVENTION

1. Field of the Invention

The present invention relates to a synchronization control circuit used for the synchronization of an external clock and an internal clock, a semiconductor device using the synchronization control circuit, and a control method of the synchronization control circuit.

Priority is claimed on Japanese Patent Application No. 2008-219744, filed Aug. 28, 2008, the content of which is incorporated herein by reference.

2. Description of Related Art

An SDRAM having a DLL (Delay Locked Loop) is controlled by using two internal clocks of an internal clock PCLK, which is delayed from an external clock CK (which lags behind the external clock CK in phase), and an internal clock LCLK, which leads the external clock CK (which leads the external clock CK in phase). Here, the internal clock PCLK is a clock obtained when the external clock CK is delayed due to a wiring line and the like in the SDRAM. On the other hand, the internal clock LCLK is an output clock of the DLL. For example, a control signal input from the outside at the time of READ or ODT (On Die Termination) operation is input to the SDRAM in synchronization with the delayed internal clock PCLK, and each operation is controlled in synchronization with the leading internal clock LCLK in the SDRAM. Thus, in the SDRAM, it is necessary to perform a change operation (synchronization) between clocks with different phases for a predetermined signal.

Such a known technique is disclosed in Japanese Unexamined Patent Application, First Publications, Nos H9-186680 and 2000-269784. A technique of performing the change between clock signals with different timings using a flip-flop is disclosed in Japanese Unexamined Patent Application, First Publication, No H9-186680 (hereinafter, Patent Document 1). In the technique disclosed in this document, however, the divide ratio of the frequency divider 22 (FIG. 1 in Patent Document 1) is fixed. For this reason, since the latency between change clocks cannot be changed, it cannot be used as the latency counter of the SDRAM. Furthermore, a signal processor which controls the latency using a frequency-divided clock is disclosed in Japanese Unexamined Patent Application, First Publication, No 2000-269784 (hereinafter, Patent Document 2). However, a method of counting the number of latency stages in a signal processing circuit 101a (FIG. 1 in Patent Document 2), and the like, is not disclosed. Moreover, the change between clock signals with different timings is not disclosed either.

On the other hand, in order to perform the above-described change operation (synchronization) in the known SDRAM, a synchronization control circuit that performs the change operation (synchronization) by delaying the internal clock LCLK stepwise and transmitting input data to a plurality of flip-flops cascade-connected to each other in a sequential manner by the delayed clock is known.

SUMMARY

In one embodiment, there is provided a device that includes at least: a first control circuit receiving a first signal in response to a first clock and generating a second signal; and a second control circuit receiving the second signal in response to a second clock which leads in phase from the first clock, outputting a third signal to an output node thereof and including a divider which has a variable divide ratio, the second control circuit controlling an output timing at which the second control circuit outputs the third signal in response to the variable divide ratio.

Moreover, in another embodiment, there is provided a device that includes at least: a clock generating circuit receiving an external clock and generating a first internal clock, the first internal clock delayed in phase from the external clock; a DLL circuit receiving the external clock and generating a second internal clock, the second internal clock leading in phase to the external clock; a first control circuit receiving a first signal in response to the first internal clock and generating a second signal; a second control circuit receiving the second signal in response to the second internal clock, outputting a third signal and including a divider which has a variable divide ratio, the second control circuit controlling an output timing at which the second control circuit outputs the third signal in response to the variable divide ratio; and an input/output circuit receiving the third signal and operating on an operation being based on the first signal in response to the second internal clock.

In addition, in still another embodiment, there is provided a control method of a device that includes at least: generating a frequency-divided clock by dividing the frequency of a first clock which leads in phase by a variable divide ratio set using a divider; and output a signal synchronized with a second clock which lags in phase, in synchronization with the frequency-divided clock.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
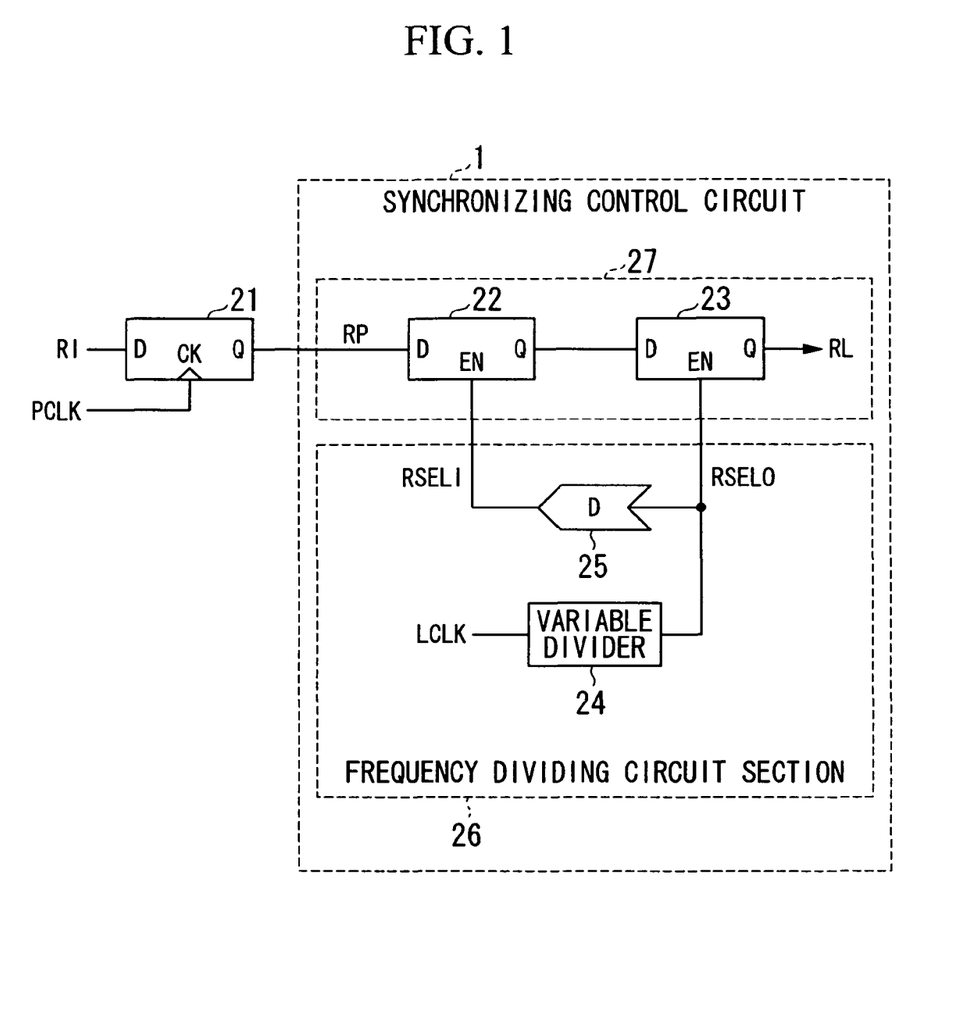
FIG. 1 is a block diagram illustrating the configuration of a first embodiment of the invention.
Figure 2:
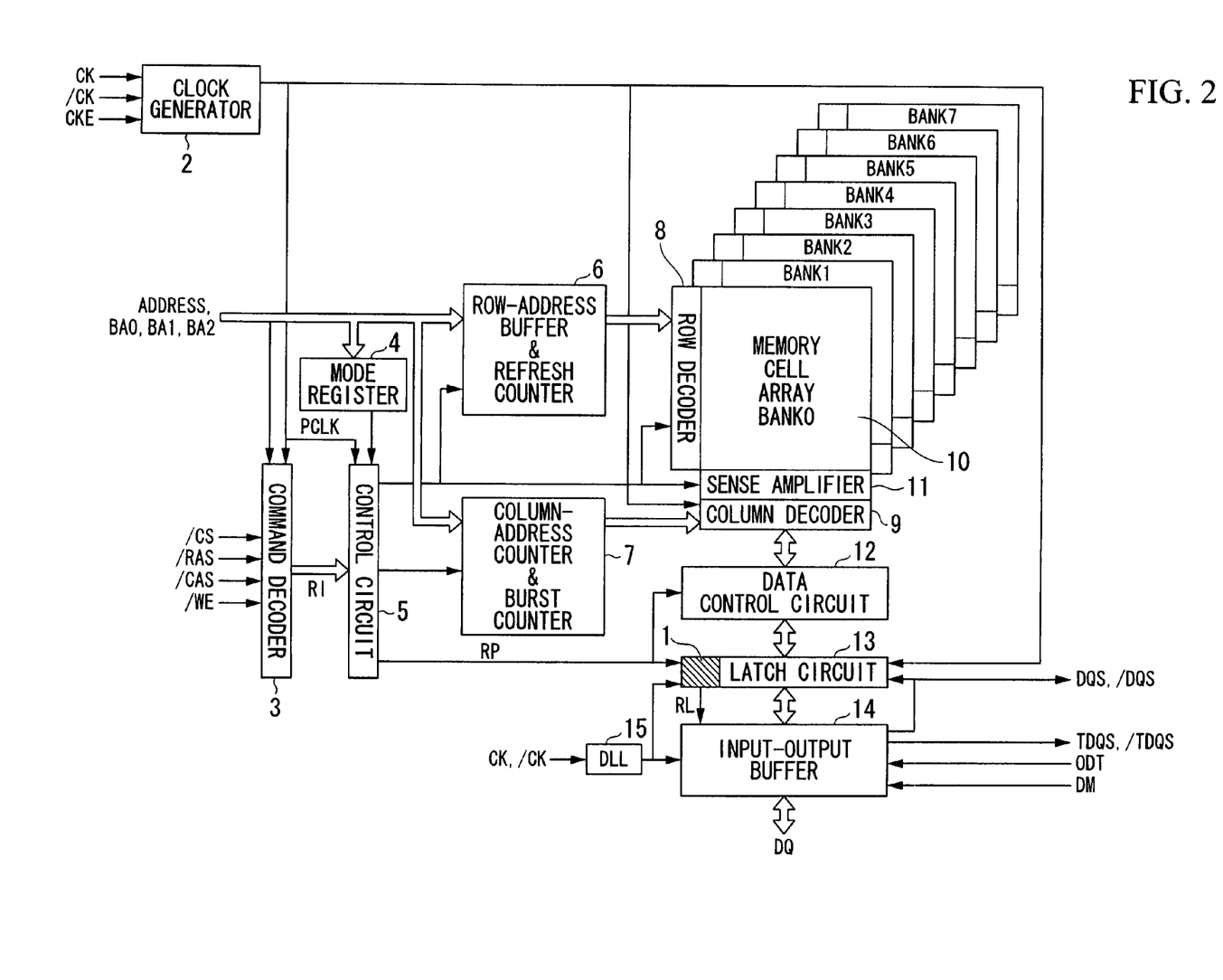
FIG. 2 is a block diagram illustrating the configuration of an SDRAM in which the embodiment is used.

Hereinafter, embodiments of the invention will be described with reference to the accompanying drawings. FIG. 1 is a block diagram illustrating the configuration of a synchronization control circuit 1 according to a first embodiment of the invention, and FIG. 2 is a block diagram illustrating the configuration of an SDRAM in which the synchronization control circuit 1 is used.

First, the SDRAM will be described. Referring to FIG. 2, reference numerals 2, 3, 4, and 5 denote a clock generator, a command decoder, a mode register, and a control circuit, respectively. Reference numeral 6 denotes row address buffer & refresh counter, and reference numeral 7 denotes column address counter & burst counter. Reference numerals 8, 9, 10, and 11 denote a row decoder, a column decoder, a memory cell array, and a sense amplifier, respectively. Reference numerals 12, 13, 14, and 15 denote a data control circuit, a latch circuit, an input/output buffer, and a DLL (Delay Locked Loop), respectively.

In the above configuration, the DLL 15 generates an internal clock on the basis of external clocks CK and /CK and outputs it to the latch circuit 13 and the input/output buffer 14. In addition, the synchronization control circuit 1 according to the present embodiment is included in the latch circuit 13 and performs synchronization between a clock output from the DLL 15 and an internal command which is output from the command decoder 3 and is supplied through the control circuit 5.

Then, referring to FIG. 1, RI is an internal Read command obtained by decoding an external command, /CS, /RAS, /CAS, and /WE. Reference numeral 21 denotes a D flip-flop provided in the control circuit 5 (FIG. 2). PCLK is an internal clock which is delayed by a predetermined time from the external clock CK (which lags behind the external clock CK in phase). In addition, the command RI is read into the flip-flop 21 by the internal clock PCLK and is then output to the synchronization control circuit 1 as a signal RP. In the synchronization control circuit 1, reference numerals 22 and 23 denote first and second latch circuits, respectively. The signal RP is input to an input end of the latch circuit 22, an output of the latch circuit 22 is input to an input end of the latch circuit 23, and an output of the latch circuit 23 is output to the input/output buffer 14 as an enable internal state signal RL. LCLK is a clock (first clock) for data output generated in the DLL 15 and is also a clock which leads the external clock CK in phase. Reference numeral 24 denotes a variable divider. The variable divider 24 divides the frequency of the clock LCLK by n (n=1 to 4) and outputs the result to the latch 23 and the delay circuit 25 as a frequency-divided clock RSELO. The delay circuit 25 delays the frequency-divided clock RSELO by a predetermined time and outputs it to the latch 22 as a delayed frequency-divided clock RSELI. Here, the variable divider 24 and the delay circuit 25 form a frequency divider section 26. In addition, the latches 22 and 23 are cascade-connected to each other to form a synchronization section 27. In addition, the delay time of the delay circuit 25 will be described later.

Figure 3:
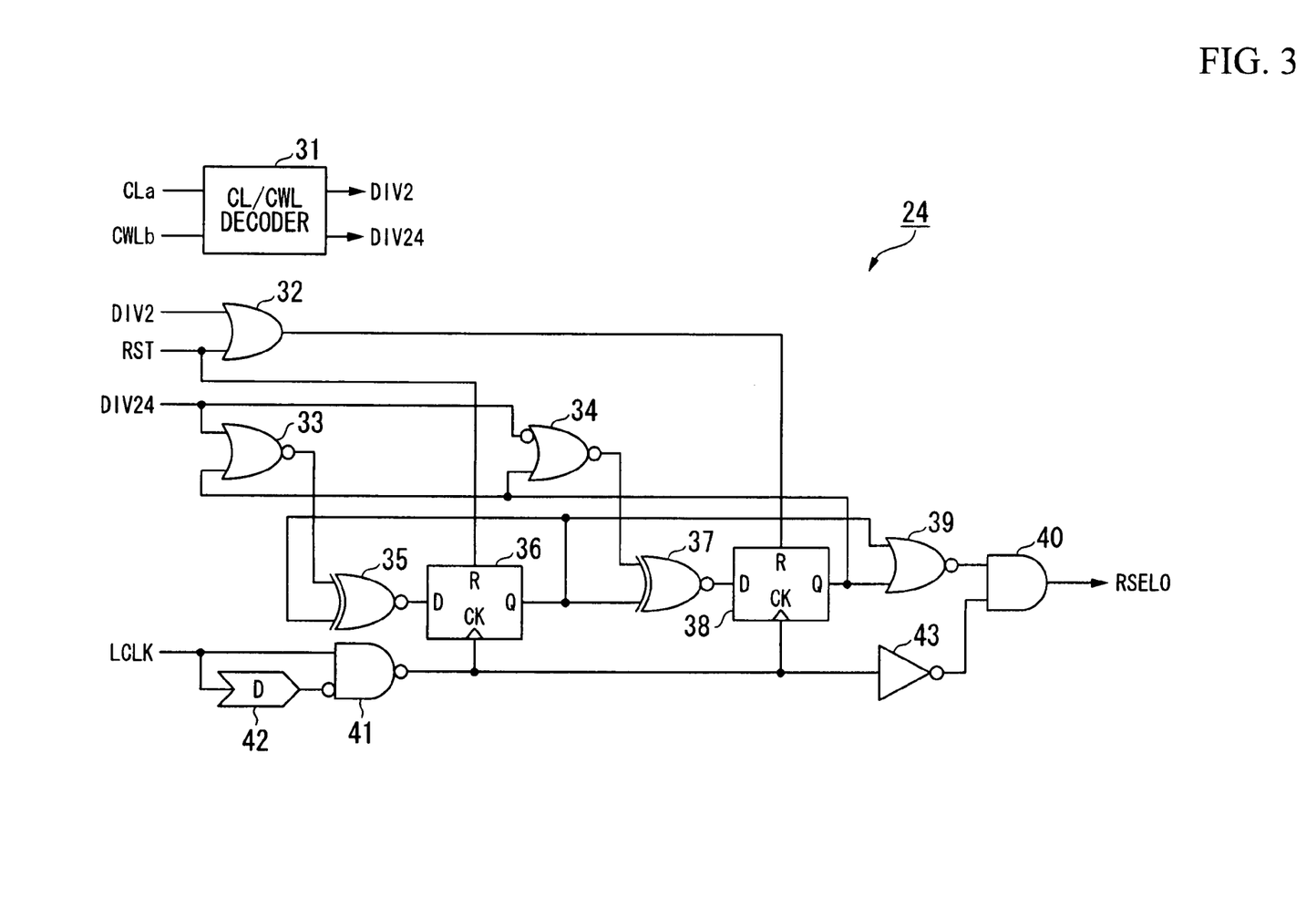
FIG. 3 is a circuit diagram illustrating the configuration of a variable divider 24 in the embodiment.

FIG. 3 is a circuit diagram illustrating the configuration of the variable divider 24. In FIG. 3, reference numeral 31 is a CL/CWL decoder which decodes latency CLa (CAS latency) and latency CWLb (CAS Write latency). The CL/CWL decoder 31 decodes the latency values CLa and CWLb and outputs signals DIV2 and DIV24. For example, when CWLb is CWL5, CWL6, CWL7, or CWL8, the following values are output as DIV2 and DIV24.

In the case of CWL5, '0' is output as DIV2 and '0' is output as DIV24, and frequency division is not performed. In the case of CWL6, '0' is output as DIV2 and '1' is output as DIV24, and the divide ratio is 2. In the case of CWL7, '1' is output as DIV2 and '0' is output as DIV24, and the divide ratio is 3. In the case of CWL8, '1' is output as DIV2 and '1' is output as DIV24, and the divide ratio is 4.

In this case, the divide ratio is determined without depending on the latency CLa. In addition, it is needless to say that the divide ratio may be determined according to the latency CLa. The latency CLa is not directly related to the latency CWLb but depends on the speed of the device in general characteristics. Accordingly, when the latency CLa has a small value, the latency CWLb also decreases.

In FIG. 3, reference numeral 32 denotes an OR circuit to which the signal DIV2 and the reset signal RST are input, and the output is input to a reset terminal of a D flip-flop 38. Reference numeral 33 is a NOR circuit having a first input end to which the signal DIV24 is input, and the output is input to a first input end of an EXNOR (exclusive NOR) circuit 35. Reference numeral 34 is a NOR circuit having a first input end to which an inverted signal of the signal DIV24 is input, and the output is supplied to a first input end of an EXNOR circuit 37. The output of a D flip-flop 36 is input to a second input end of the EXNOR circuit 35, and the output of the EXNOR circuit 35 is input to a D input end of the flip-flop 36. The reset signal RST is input to a reset terminal of the flip-flop 36, and the output of the flip-flop 36 is input to the EXNOR circuit 35 and is also input to a second input end of the EXNOR circuit 37 and a first input end of a NOR circuit 39.

The output of the EXNOR circuit 37 is input to a D input end of the flip-flop 38, the output of the flip-flop 38 is input to a second input end of the NOR circuit 39, and the output of the NOR circuit 39 is input to a first input end of an AND circuit 40. The above-described clock LCLK is input to a first input end of an NAND circuit 41, and is inverted through a delay circuit 42 and is then input to a second input end of the NAND circuit 41. The above-described NAND circuit 41 and delay circuit 42 output one pulse at the rising edge of the clock LCLK and supply it to a second input end of the AND circuit 40 through an inverter 43. Then, the output of the AND circuit 40 is output as the frequency-divided clock RSELO to the latch circuit 23 and the delay circuit 25 of FIG. 1.

The variable divider 24 with the above-configuration performs a frequency division of the internal clock LCLK generated in the DLL 15 in a frequency mode according to the signals DIV2 and DIV24 obtained by decoding the latency CLa and CWLb. The variable divider 24 divides the frequency of the internal clock LCLK by the divide ratio of 1/2/3/4 and outputs the result as the frequency-divided clock RSELO.

Next, an operation of the synchronization control circuit 1 shown in FIG. 1 will be described with reference to the timing chart shown in FIG. 4. Moreover, it is assumed that the latency CLa=4, the latency CWLb=4, and the variable divider 24 divides the frequency of the clock LCLK by 4 and outputs it.

Figure 4:
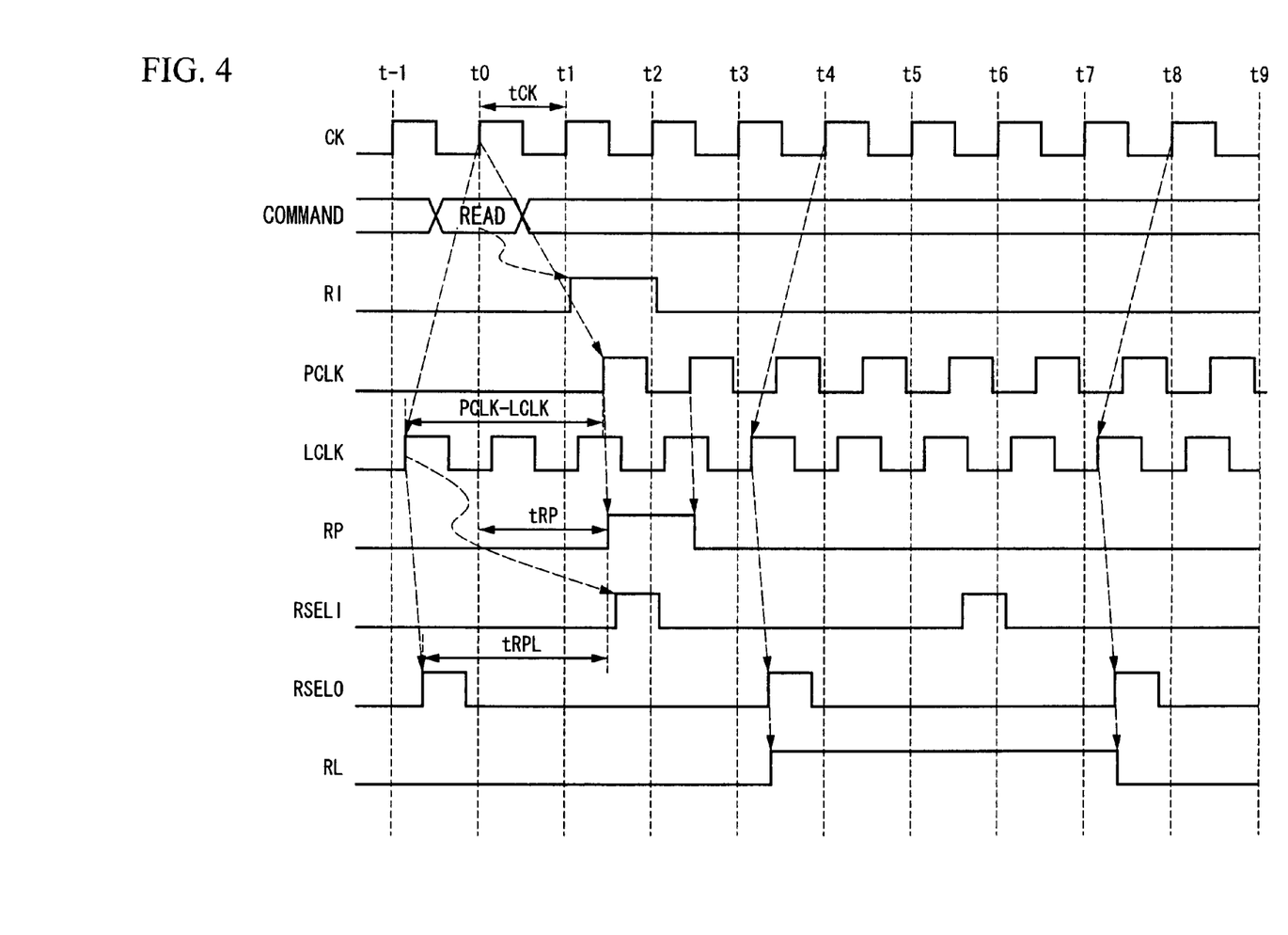
FIG. 4 is timing chart for explaining the operation of the embodiment.

FIG. 4 shows the external clock CK, and FIG. 4 shows an external command.

When the command decoder 3 (FIG. 2) receives the Read command from the outside at time t0 (FIG. 4), the command decoder 3 issues the internal command RI shown in FIG. 4. The internal command RI is read into the flip-flop 21 (FIG. 1) by the internal clock PCLK (FIG. 4) which lags behind the external clock CK in phase and is transmitted to the synchronization control circuit 1 as the signal RP (FIG. 4).

On the other hand, the internal clock LCLK (FIG. 4) generated in the DLL 15 is a clock which leads the external clock CK in phase. In the example of FIG. 4, the phase difference between the internal clock PCLK (FIG. 4) and the internal clock LCLK is two cycles or more of the external clock CK (refer to FIG. 4). The frequency-divided clock RSELO (FIG. 4) obtained by dividing the frequency of the internal clock LCLK by 4 in the variable divider 24 is generated from the internal clock LCLK (t1), and the signal RP is latched to the latch circuit 22 by the delayed frequency-divided clock RSELI (FIG. 4) obtained by delaying the frequency-divided clock RSELO and is latched to the latch circuit 23 by the next frequency-divided clock RSELO. Then, the output of the latch circuit 23 is output to the input/output buffer 14 as the enable internal state signal RL (FIG. 4). As a result, the signal RL is output as a signal (signal synchronized at t4), for which a control of latency=4 has been performed, in synchronization with the internal clock LCLK.

Here, the delay amount tDELAY of the delay circuit 25 which delays the frequency-divided clock RSELO to generate the delayed frequency-divided clock RSELI becomes tDELAY=tRPL+α. In this expression, 'tRPL' is the phase difference between the frequency-divided clock RSELO (t0) based on the external clock CK at to and the signal RP based on the internal clock PCLK at t0 as shown in FIG. 4, and 'α' is a predetermined amount determined by the latch margin or tCKmin margin (margin of the external clock CK for the minimum clock period).

Figure 5:
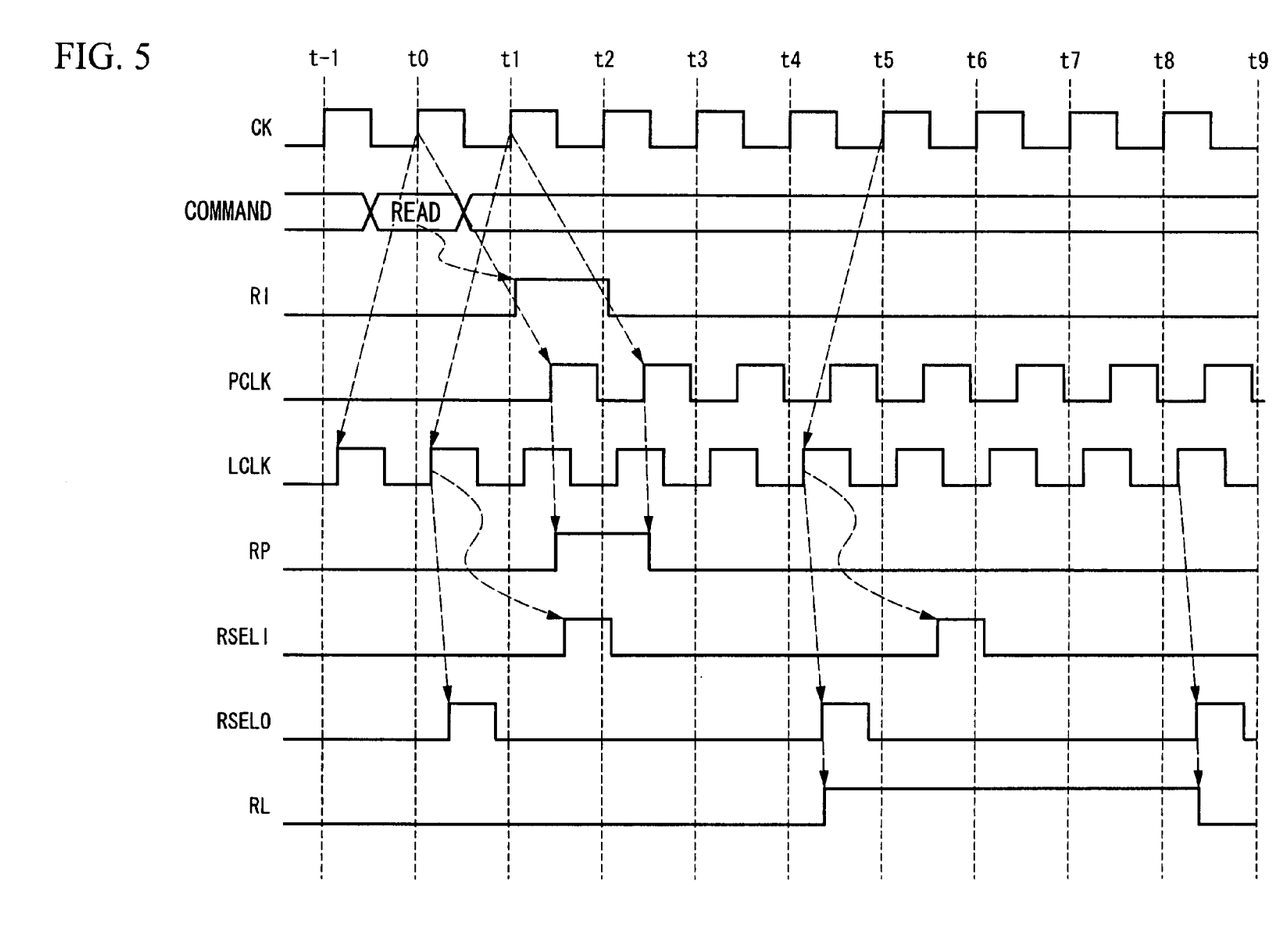
FIG. 5 is timing chart for explaining another example of the operation of the embodiment.

FIG. 5 shows the case where the delay amount (tDELAY; the delay amount of the delay circuit 25 of FIG. 1), which is required to generate the delayed frequency-divided clock RSELI by delaying the frequency-divided clock RSELO, is set to tDELAY=tRPL+α−tCK. That is, this is the case where the delay amount tDELAY is set smaller than that shown in the waveform chart of FIG. 4 by one cycle (tCK) of the external clock CK. In this case, a delay element of the delay circuit 25 can be made small, compared with the case shown in FIG. 4. The latency is converted into the divide ratio of +1 of the frequency divider. For example, in FIG. 5, it is set to latency=5 since the clock divided by the divide ratio of 4 is used.

When the Read command (FIG. 5) is received at time t0 shown in FIG. 5, the internal command RI (FIG. 5) is issued. The command RI is latched at the internal command PCLK (FIG. 5), which lags behind the external clock CK in phase, and is then transmitted to the synchronization control circuit 1 as the signal RP (FIG. 5). On the other hand, the internal clock LCLK (FIG. 5) generated in the DLL 15 is a clock which leads the external clock CK in phase. In this example, the phase difference between the clock PCLK and the clock LCLK is two cycles or more of the external clock CK (refer to FIG. 5). The frequency-divided clock RSELO which is a clock obtained by dividing the frequency of the clock LCLK by 4 is generated from the internal clock LCLK (t1) in the variable divider 24 (FIG. 5). The internal Read signal RP is latched at the delayed frequency-divided clock RSELI obtained by delaying the frequency-divided clock RSELO and the internal state signal RL (FIG. 5) for the input/output buffer 14 (FIG. 2) is output at the frequency-divided clock RSELO after four cycles. As a result, the signal RL is output as a signal (signal synchronized at t5), for which a control of latency=5 has been performed, in synchronization with the internal clock LCLK.

Details of the first embodiment of the invention have been described until now. According to the above-described embodiment, the synchronization control circuit 1 is formed by the two latch circuits 22 and 23 and the frequency divider section 26, and the divide ratio of the variable divider 24 of the frequency divider section 26 is changed according to latency. For this reason, in the synchronization control circuit 1 according to the present embodiment, the synchronization margin can be set to be large even if a number of delay elements are not used for the delay circuit 25. Accordingly, the latency control can also be performed simultaneously. As a result, the area or power consumption of the synchronization control circuit 1 and latency counter circuit can be reduced.

There is also a known SDRAM which is configured to be able to change latency setting according to the operation speed and has a latency counter for counting the latency. However, there is a limitation in increasing the operation speed of the SDRAM when the frequency of the external clock CK becomes high. For this reason, the value of each latency (for example, CL or CWL) also becomes large when the frequency of the external clock CK becomes high. As a result, the number of flip-flops for performing latency counting is increased, which has caused a problem that the chip area or the power consumption increases. In the above-described embodiment, such a problem can be solved.

Moreover, although the case of the latency control at the time of Read was described as the example in the above embodiment, the invention is not limited thereto. The invention may also be applied to the latency control for Rtt (internal resistance value) change or On/Off of ODT in the ODT, such as ODT or Dynamic ODT. In addition, the area and the power consumption can be further reduced by sharing the synchronization control circuit for Read, clock change for ODT and Dynamic ODT, and latency control.

Figure 6A:
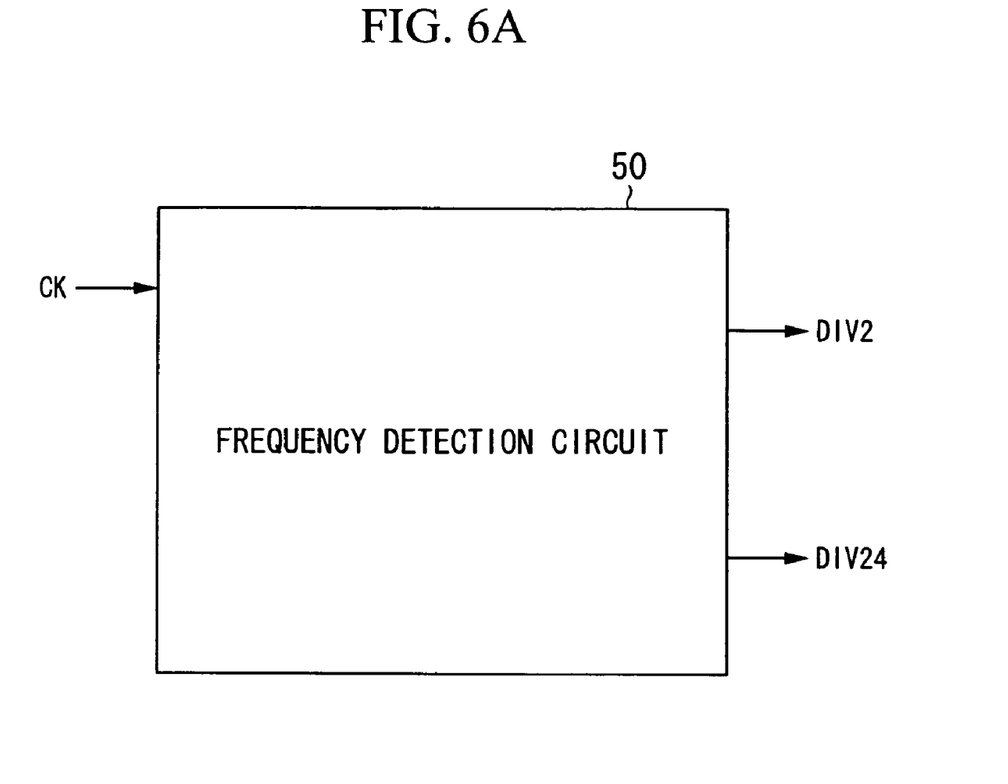
FIGS. 6A and 6B are views for explaining the modification of the embodiment.
Figure 6B:
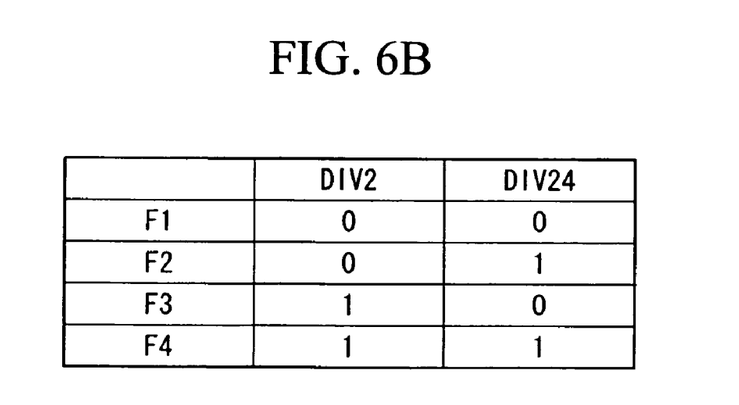

Moreover, in the above-described embodiment, the divide ratio was changed by setting of the latency CLa and CWLb. However, for example, the divide ratio of the internal clock may be changed according to the frequency of the external clock CK using the result of a frequency detection circuit. FIG. 6A shows a frequency detection circuit 50, and FIG. 6B shows the signals DIV2 and DIV24 which are the outputs. For example, when the period tCK of the external clock CK is 2500 ns (nanosecond) or more, the outputs of the frequency detection circuit 50 are in the range F1. When the period tCK of the external clock CK is equal to or more than 1875 ns (nanosecond) and less than 2500 ns (nanosecond), the outputs of the frequency detection circuit 50 are in the range F2. When the period tCK of the external clock CK is equal to or more than 1500 ns (nanosecond) and less than 1875 ns (nanosecond), the outputs of the frequency detection circuit 50 are in the range F3. When the period tCK of the external clock CK is equal to or more than 1250 ns (nanosecond) and less than 1500 ns (nanosecond), the outputs of the frequency detection circuit 50 are in the range F4. It is determined whether or not the period tCK of the external clock CK belongs to one of the ranges, and the signals DIV2 and DIV24 are output according to the result (refer to FIG. 6B).

Next, a second embodiment of the invention will be described.

Figure 7:
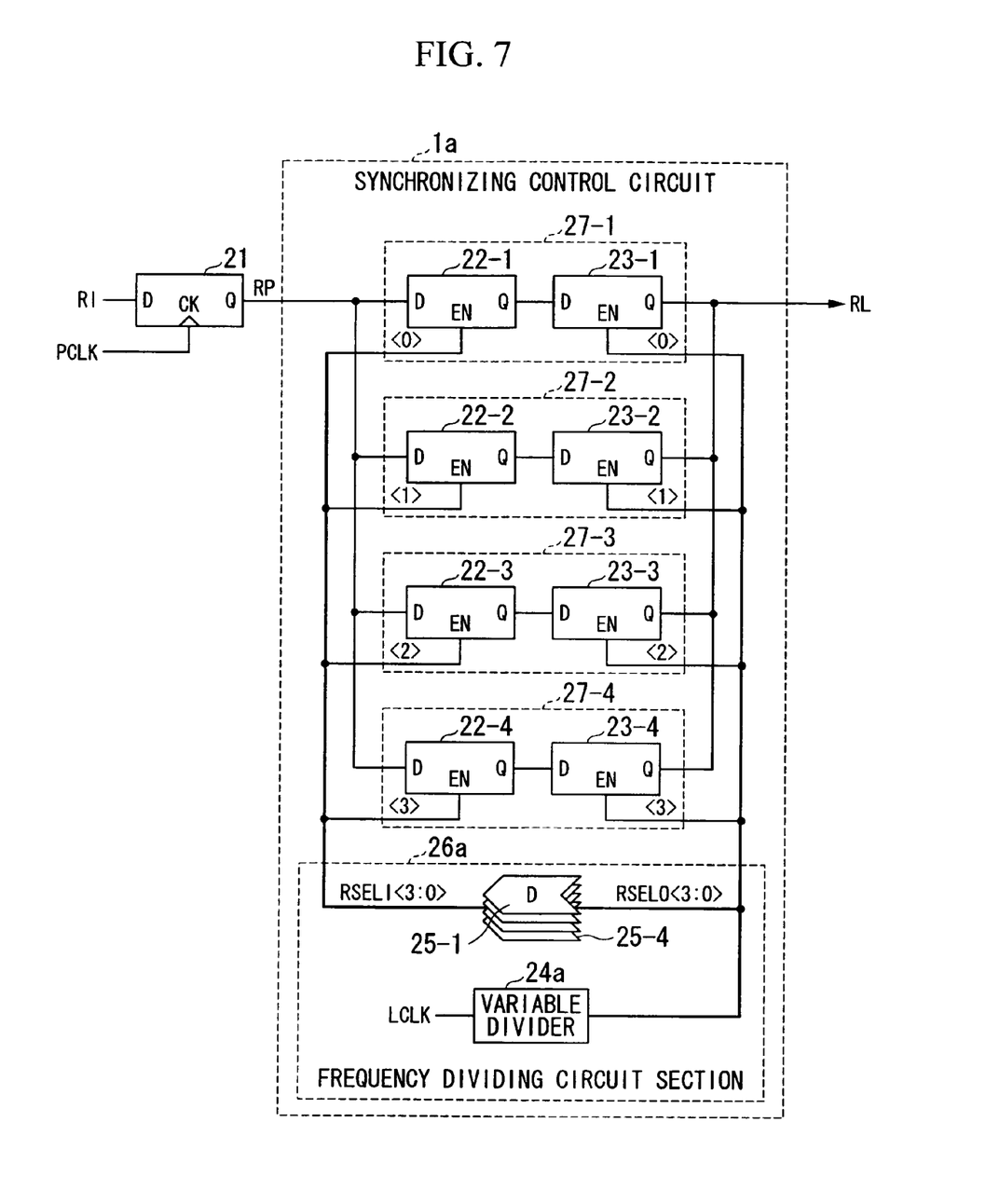
FIG. 7 is a block diagram illustrating the configuration of a second embodiment of the invention.

FIG. 7 is a circuit diagram illustrating the configuration of a synchronization control circuit 1a according to the present embodiment. The present embodiment is an embodiment corresponding to continuous Read command input (refer to FIG. 9).

In FIG. 7, the clock PCLK is an internal clock which is delayed from the external clock CK (which lags behind the external clock CK in phase). The command RI is an internal Read command obtained by decoding an external command, /CS, /RAS, /CAS, and /WE. The internal Read command RI is read into a D flip-flop 21 by the internal clock PCLK and is then output as the signal RP to latches 22-1 to 22-4 of the synchronization control circuit 1a. The latches 22-1 to 22-4 read a signal RP in response to a delayed frequency-divided clock RSELI<3:0> output from the delay circuits 25-1 to 25-4 and output it to latches 23-1 to 23-4. The latches 23-1 to 23-4 read the outputs of the latches 22-1 to 22-4 in response to a frequency-divided clock RSELO<3:0> output from the variable divider 24a and output it to the input/output buffer 14 of FIG. 2 as the internal state signal RL for enable. Thus, the latches 22-1 and 23-1 are cascade-connected, the latches 22-2 and 23-2 are cascade-connected, the latches 22-3 and 23-3 are cascade-connected, and the latches 22-4 and 23-4 are cascade-connected. The latches 22-1 and 23-1 form a synchronization section 27-1, the latches 22-2 and 23-2 form a synchronization section 27-2, the latches 22-3 and 23-3 form a synchronization section 27-3, and the latches 22-4 and 23-4 form a synchronization section 27-4. In addition, the synchronization sections 27-1 to 27-4 are connected in parallel.

The internal clock LCLK is a clock for data output generated in the DLL 15 (FIG. 2) and is also a clock which leads the external clock CK in phase. The frequency-divided clock RSELO<3:0> is four frequency-divided clocks generated in the variable divider 24a and is a clock obtained by dividing the frequency of the internal clock LCLK by n (n=1~4). The frequency-divided clocks RSELO<0>, RSELO<1>, RSELO<2>, and RSELO<3> are shifted from each other by one period of the internal clock LCLK (refer to FIG. 9). In addition, the delayed frequency-divided clock RSELI<3:0> is obtained by delaying the four frequency-divided clocks RSELO<3:0> with the delay circuits 25-1 to 25-4, respectively.

Figure 8:
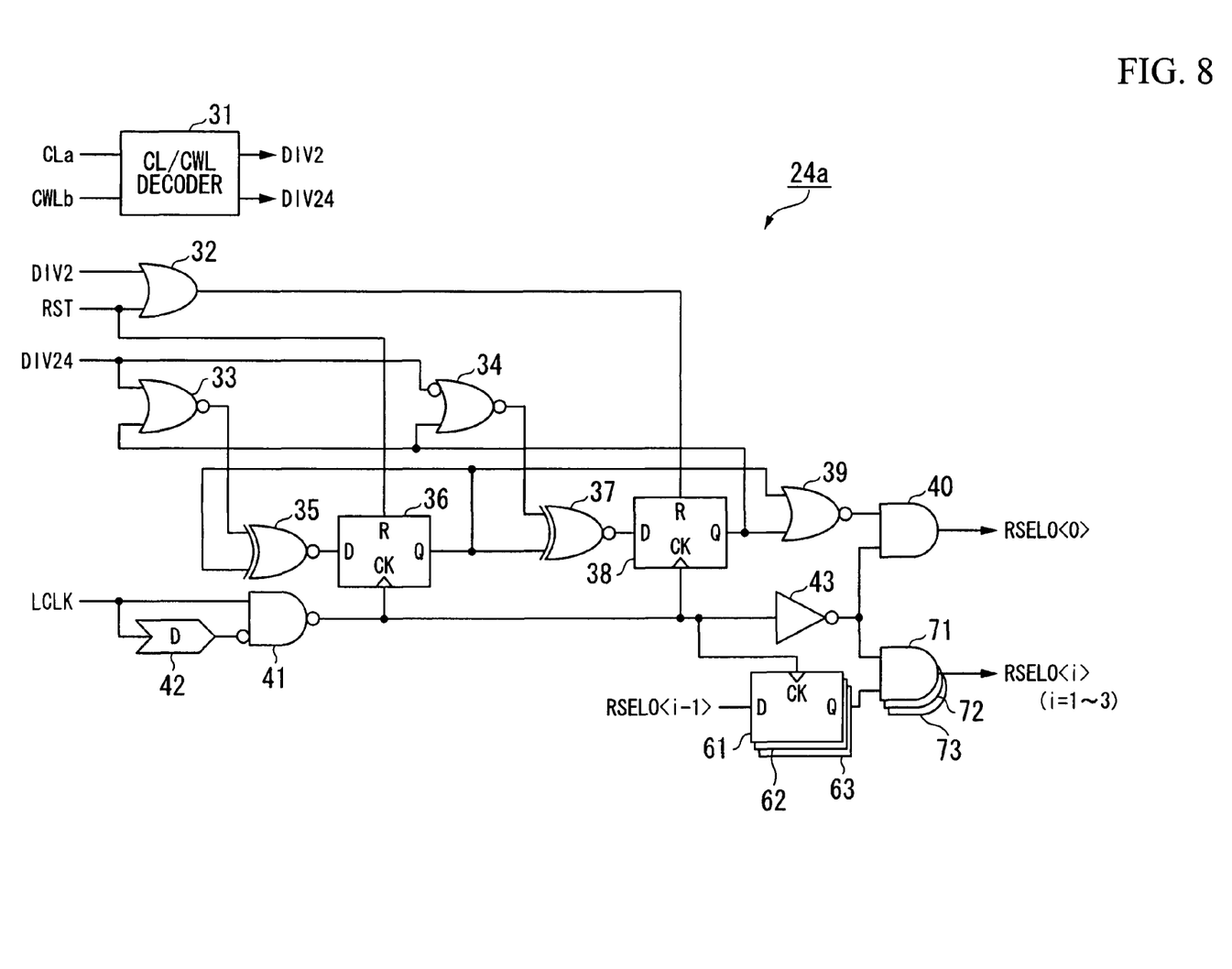
FIG. 8 is a circuit diagram illustrating the configuration of a variable divider 24a in the embodiment.

FIG. 8 is a circuit diagram illustrating the configuration of the variable divider 24a. In FIG. 8, the same portions as in FIG. 3 are denoted by the same reference numerals. The circuit shown in FIG. 8 is different from that shown in FIG. 3 in that D flip-flops 61 to 63 and AND circuits 71 to 73 are provided. The D flip-flop 61 reads the frequency-divided clock RSELO<0> output from the AND circuit 40 at timing of the internal clock LCLK and outputs it to the AND circuit 71. The AND circuit 71 performs an AND operation between the output of an inverter 43 and the output of the flip-flop 61 and outputs it as the frequency-divided clock RSELO<1>. Similarly, the D flip-flop 62 reads the frequency-divided clock RSELO<1> output from the AND circuit 71 at timing of the internal clock LCLK and outputs it to the AND circuit 72. The AND circuit 72 performs an AND operation between the output of the inverter 43 and the output of the flip-flop 62 and outputs it as the frequency-divided clock RSELO<2>. The D flip-flop 63 reads the frequency-divided clock RSELO<2> output from the AND circuit 72 at timing of the internal clock LCLK and outputs it to the AND circuit 73. The AND circuit 73 performs an AND operation between the output of the inverter 43 and the output of the flip-flop 63 and outputs it as the frequency-divided clock RSELO<3>.

In the above-described circuits, the frequency division modes are switched in the range where the frequency is divided by the divide ratios of 1 to 4 by the combination of each latency setting (CLa, CWLb), and the frequency-divided clock RSELO<0> is output as clocks obtained by dividing the frequency of the internal clock LCLK by 1/2/3/4. In addition, the frequency-divided clock RSELO<1> is a clock shifted from the frequency-divided clock RSELO<0> by one cycle of the internal clock LCLK, the frequency-divided clock RSELO<2> is a clock shifted from the frequency-divided clock RSELO<1> by one cycle of the internal clock LCLK, and the frequency-divided clock RSELO<3> is a clock shifted from the frequency-divided clock RSELO<2> by one cycle of the internal clock LCLK.

Figure 9:
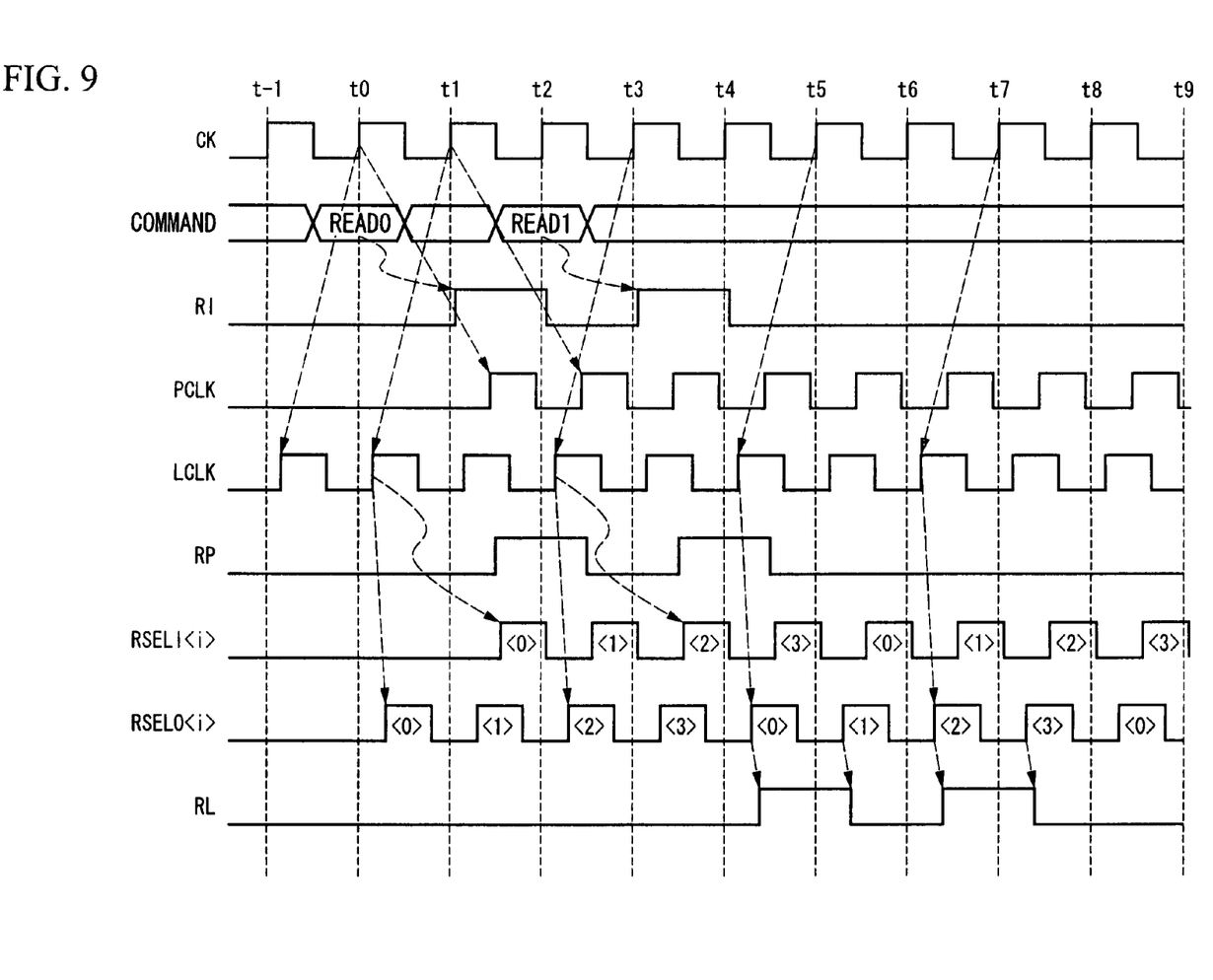
FIG. 9 is timing chart for explaining the operation of the embodiment.

Next, an operation of the above embodiment will be described with reference to the timing chart shown in FIG. 9. FIG. 9 shows an example of the continuous Read operation when the Read latency=5.

When a Read command 'Read0' is received at time t0, an internal Read command RI (t0) is issued (FIG. 9). The command RI (t0) is read into the D flip-flop 21 by the internal clock PCLK which lags behind the external clock CK in phase and is transmitted to the synchronization control circuit 1a as a signal RP (t0) (FIG. 9). On the other hand, in the variable divider 24a, the frequency-divided clock RSELO<0> which is a clock obtained by dividing the frequency of the clock LCLK by 4 is generated from the internal clock LCLK (t1) (FIG. 9). The internal Read signal RP (t0) is latched to the latch 22-1 at the delayed frequency-divided clock RSELI<0> obtained by delaying the frequency-divided clock RSELO<0> and is read into the latch 23-1 by the frequency-divided clock RSELO<0> after four cycles. Then, it is output to the input/output buffer 14 (FIG. 2) as the signal RL (t5).

Then, when the next Read command 'Read1" (FIG. 9) is received at time t2 after two cycles from the time t0, the internal Read command RI (t2) is issued. The command RI (t2) is read into the D flip-flop 21 by the internal clock PCLK and is then transmitted to the synchronization control circuit 1a as the signal RP (t2). On the other hand, in the variable divider 24a, the frequency-divided clock RSELO<2> is generated from the internal clock LCLK (t3) (FIG. 9). The internal Read signal RP (t2) is latched to the latch 22-3 at the delayed frequency-divided clock RSELI<2> obtained by delaying the frequency-divided clock RSELO<2> and is read into the latch 23-3 by the frequency-divided clock RSELO<2> after four cycles. Then, it is output to the input/output buffer 14 (FIG. 2) as the signal RL (t7).

As a result, the signal RL (t5) is output as a signal, for which a control of latency=5 has been performed corresponding to the command input at time t0, in synchronization with the internal clock LCLK, and the signal RL (t7) is output as a signal, for which a control of latency=5 has been performed corresponding to the command input at time t2, in synchronization with the internal clock LCLK.

Details of the second embodiment of the invention have been described until now. According to the embodiment described above, the same effects as in the first embodiment can be acquired. In addition, although the input timing of the external command is restricted according to the divide ratio of the variable divider in the configuration of the first embodiment, the synchronization control circuit 1a can detect the Read state for every cycle of the external clock CK in the second embodiment. Accordingly, it is possible to acquire the effect that the input timing of the external command is not restricted.

In addition, the synchronization control circuits of the invention are the synchronization control circuits 1 and 1a. In addition, the first latch circuit and first holding unit of the invention are the latches 22 and 22-1 to 22-4. In addition, the second latch circuit and second holding unit of the invention are the latches 23 and 23-1 to 23-4. The variable dividers of the invention are the variable dividers 24 and 24a. In addition, the delay circuits of the invention are the delay circuits 25 and 25-1 to 25-4. In addition, the frequency divider sections of the invention are the frequency divider sections 26 and 26a. In addition, the synchronization sections of the invention are the synchronization sections 27 and 27-1 to 27-4. In addition, the frequency detection circuit of the invention is the frequency detection circuit 50. In addition, the first clock of the invention is the internal clock LCLK. In addition, the second clock of the invention is the internal clock PCLK. In addition, the frequency-divided clocks of the invention are the frequency-divided clocks RSELO, RSELO<0>, RSELO<1>, RSELO<2>, and RSELO<3>. In addition, the delayed frequency-divided clocks of the invention are the delayed frequency-divided clock RSELI, RSELI<0>, RSELI<1>, RSELI<2>, RSELI<3>, and RSELI<3:0>.

According to the invention, since the frequency divider section includes the variable divider that divides the frequency of the first clock by the predetermined divide ratio which can be changed, the synchronization margin can be set to be large even if a number of delay elements are not used for the delay circuit. Accordingly, the area or power consumption of the synchronization control circuit can be reduced.

It is apparent that the present invention is not limited to the above embodiments, but may be modified and changed without departing from the scope and spirit of the invention.

What is claimed is:

1. A device comprising:
   a first control circuit receiving a first signal in response to a first clock and generating a second signal; and
   a second control circuit receiving the second signal in response to a second clock which leads in phase from the first clock, outputting a third signal to an output node thereof and including a divider which has a variable divide ratio, the second control circuit controlling an output timing at which the second control circuit outputs the third signal in response to the variable divide ratio,
   wherein the second control circuit includes a first synchronization unit coupled between the first control circuit and the output node, and the synchronization unit comprises a first latch circuit receiving the second signal at a first receiving timing and a second latch circuit connected in series to the first latch circuit and outputting the third signal to the output node at a first output timing,
   wherein the divider supplies the first latch circuit and the second latch circuit with a first timing signal and a second timing signal, respectively, and the first timing signal and the second timing signal correspondingly define the first receiving timing and the first output timing,
   wherein the second control circuit includes a first delay circuit, and
   wherein the divider divides the second clock by the variable divide ratio so as to generate a first divided clock, and the divider supplies the first divided clock to the first delay circuit such that the first delay circuit generates the first timing signal in response to the first divided clock and supplies the first timing signal to the first latch circuit.

2. The device as claimed in claim 1, wherein the divider supplies the second latch circuit with the first divided clock as the second timing signal.

3. The device as claimed in claim 1, wherein a delay time provided the first delay circuit is based on a difference in phase between the first timing signal and the first clock.

4. The device as claimed in claim 1, further comprising a frequency detection circuit which detects a frequency of an external clock, and
   wherein the variable divide ratio of the divider is set with reference to a detection result supplied from the frequency detection circuit.

5. The device as claimed in claim 1, wherein the second control circuit includes a second synchronization unit connecting in parallel to the first control circuit, the second synchronization unit comprises a third latch circuit receiving the second signal at a second receiving timing different from the first receiving timing and a fourth latch circuit connecting in series to the third latch circuit and outputting the third signal at a second output timing different from the first output timing.

6. The device as claimed in claim 5, wherein the divider supplies the first latch circuit, the second latch circuit, the third latch circuit and the fourth latch circuit with a first timing signal, a second timing signal, a third timing signal, and a fourth timing signal, respectively, and the first timing signal, the second timing signal, the third timing signal, and the fourth timing signal correspondingly define the first receiving timing, the first output timing, the second receiving timing and the second output timing.

7. The device as claimed in claim 6, wherein the second control circuit includes a first delay circuit and a second delay circuit, and
   wherein the divider divides the second clock by the variable divide ratio so as to generate a first divided clock and a second divided clock which is different in phase from a first divided clock, the divider supplies the first divided clock to the first delay circuit such that the first delay circuit generates the first timing signal in response to the first divided clock and supplies the first timing signal to the first latch circuit, and the divider supplies the second divided clock to the second delay circuit such that the second delay circuit generates the third timing signal in response to the second divided clock and supplies the third timing signal to the third latch circuit.

8. The device as claimed in claim 7, wherein the divider supplies the second latch circuit with the first divided clock as the second timing signal and supplies the fourth latch circuit with the second divided clock as the fourth timing signal.

9. The device as claimed in claim 5, wherein the second control circuit includes a third synchronization unit connecting in parallel to the first and second control circuits and a fourth synchronization unit connecting in parallel to the first, second, and third control circuits, the third synchronization unit comprises a fifth latch circuit receiving the second signal at a third receiving timing different from the first and second receiving timings and a sixth latch circuit connecting in series to the fifth latch circuit and outputting the third signal at a third output timing different from the first and second output timings, and the fourth synchronization unit comprises a seventh latch circuit receiving the second signal at a fourth receiving timing different from the first, second, and third timings and a eighth latch circuit connecting in series to the sixth latch circuit and outputting the third signal at a fourth output timing different from the first, second, and third output timings.

10. A device comprising:
    a first control circuit receiving a first signal and generating a second signal in response to a first clock; and
    a second control circuit including a divider circuit, a first delay circuit and the first circuit unit, the divider circuit receiving a second clock that leads in phase from the first clock and dividing the second clock by a variable divide ratio to generate a first divided clock, the first delay circuit receiving the first divided clock and delaying the first divided clock to generate a second divided clock, and the first circuit unit receiving the second signal in response to the second divided clock and outputting a third signal in response to the first divided clock.

11. The device as claimed in claim 10, wherein the second control circuit includes first and second latch circuits coupled in series to each other so that an output node of the first latch circuit is coupled to the input node of the second latch circuit, the first latch circuit receives the second divided clock at a clock node thereof and the second latch circuit receives the first divided clock at a clock node thereof.

12. The device as claimed in claim 10, wherein the first delay circuit of the second control circuit delays the first divided clock for a delay time depending on a difference in phase between the first clock and the first divided clock.

13. The device as claimed in claim 10, wherein the first control circuit generates the second signal in response to each occurrence of the first signal, the divider circuit of the second control circuit divides the second clock to generate a third divided clock after generating the first divided clock, the second control circuit further includes a second delay circuit that receives the third divided clock and delays the third divided clock to generate a fourth divided clock, the first circuit unit responds to the second divided clock with receiving the second signal generated in response to a first occurrence of the first signal and responds to the first divided clock with outputting the third signal generated in response to the first occurrence of the first signal, and the second circuit unit responds to the fourth divided clock with receiving the second signal with generating a second occurrence, following the first occurrence of the first signal, of the first signal and responds to the third divided clock with outputting the third signal generated in response to the second occurrence of the first signal.

14. The device as claimed in claim 10, wherein the divider circuit of the second control circuit includes first and second circuit portions, the first circuit portion generates the first divided clock and the second circuit portion receives the first divided clock and generates the third divided clock in response to the first divided clock.

15. A device comprising:
a first clock generator circuit generating a first internal clock based on an external clock, the first internal clock being retarded in phase from the external clock;
a second clock generator circuit generating a second internal clock based on the external clock, the second internal clock leading in phase from the first internal clock;
a control circuit receiving an external command and decoding the external command to generate a first internal command in response to the first internal clock;
a first circuit unit including a divider circuit that has a variable divide ratio, the first circuit unit coupled to receive the first internal command in response to the second internal clock and outputting a second internal command based on the first internal command at a timing depending on the variable divide ratio; and
an internal circuit responding to the second internal command and performing a circuit operation designated by the second internal command.

16. The device as claimed in claim 15, wherein the internal circuit includes a memory cell array operating in response to the first internal clock and an input/output circuit operating in response to the second internal clock.

17. The device as claimed in claim 16, wherein the external command includes one of read and write commands, the control circuit responds to the read command with generating an internal read command and responds to the write commands with generating an internal write command, the input/output circuit receives one of the internal read command and the internal write command at the timing depending on the variable divide ratio, and the input/output circuit responds to the internal read command with outputting a read data supplied from the memory cell array to a data terminal of the device and responds to the internal write command with supplying a write data supplied from the data terminal of the device to the memory cell array.

18. The device as claimed in claim 15, wherein the divider circuit of the control circuit divides the second internal clock by the variable divide ratio, the first circuit unit further includes the first circuit portion and a delay circuit, the delay circuit receives the first divided clock and delays the first divided clock to generate a second divided clock, the first circuit portion receives the first internal command in response to the second divided clock and outputs the second internal command in response to the first divided clock.

* * * * *